United States Patent [19]
Yang

[11] Patent Number: 5,913,102
[45] Date of Patent: Jun. 15, 1999

[54] METHOD FOR FORMING PATTERNED PHOTORESIST LAYERS WITH ENHANCED CRITICAL DIMENSION UNIFORMITY

[75] Inventor: Dah Jong Ou Yang, Yuanho, Taiwan

[73] Assignee: Taiwan Semiconductor Manufacturing Company, Ltd., Hsin-Chu, Taiwan

[21] Appl. No.: 08/822,245

[22] Filed: Mar. 20, 1997

[51] Int. Cl.⁶ .................................................. H01L 21/66
[52] U.S. Cl. ................................................. 438/14; 438/17
[58] Field of Search ................................. 438/14, 16, 17, 438/725, 948, 949; 430/30, 313

[56] References Cited

U.S. PATENT DOCUMENTS

| | | | |
|---|---|---|---|
| 4,600,597 | 7/1986 | White et al. | 427/9 |
| 4,661,203 | 4/1987 | Smith et al. | 156/643 |
| 4,814,244 | 3/1989 | Koguchi et al. | 430/30 |
| 5,324,689 | 6/1994 | Yoo | 437/228 |
| 5,427,878 | 6/1995 | Corliss | 430/30 |
| 5,723,237 | 3/1998 | Kobayashi et al. | 430/30 |
| 5,783,099 | 7/1998 | Huh | 438/17 |
| 5,835,226 | 11/1998 | Berman et al. | 356/382 |

*Primary Examiner*—John F. Niebling
*Assistant Examiner*—Michael S. Lebentritt
*Attorney, Agent, or Firm*—George O. Saile; Stephen B. Ackerman; Alek P. Szecsy

[57] ABSTRACT

A method for forming a patterned photoresist layer within an integrated circuit. The method employs a measurement parameter and a control parameter, which when at a measurement parameter target value and a control parameter target value provide a patterned photoresist layer with a target critical dimension. There is also determined a measurement parameter correlation coefficient and a control parameter correlation coefficient, each of which correlates with the patterned photoresist layer target critical dimension. When forming the patterned photoresist layer, the measurement parameter value is measured and variations of the measurement parameter from the measurement target value are compensated through varying the control parameter from the control target value while employing the measurement parameter correlation coefficient and the control parameter correlation coefficient. Through the method a patterned photoresist layer with controlled and enhanced critical dimension uniformity is formed.

10 Claims, 7 Drawing Sheets

METHOD FOR FORMING PATTERNED PHOTORESIST LAYERS WITH ENHANCED CRITICAL DIMENSION UNIFORMITY

BACKGROUND OF THE INVENTION

1. Field of the Invention

The present invention relates generally to methods for forming patterned layers within integrated circuits. More particularly, the present invention relates to methods for controlling and enhancing critical dimension uniformity of patterned photoresist layers employed in defining patterned layers within integrated circuits.

2. Background of the Invention

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

In the process of forming electrical circuit elements, patterned conductor layers and patterned dielectric layers within integrated circuits it is common in the art of integrated circuit fabrication to define the dimensions, and in particular the critical dimensions, of those electrical circuit elements, patterned conductor layers and patterned dielectric layers through etch methods which employ patterned photoresist layers as photoresist etch mask layers. While the use of patterned photoresist layers for defining within integrated circuits electrical circuit elements, patterned conductor layers and patterned dielectric layers has become quite common in the art, the methods through which are formed those patterned photoresist layers nonetheless still often provide patterned photoresist layers with significant critical dimension non-uniformity. The critical dimension non-uniformity often becomes significant as the magnitude of the critical dimension of patterned photoresist layers within integrated circuits becomes smaller, since within many photolithographic methods the critical dimension uniformity may remain constant while the critical dimension magnitude decreases. It is thus significant in the art of integrated circuit fabrication to devise methods through which the critical dimension uniformity within patterned photoresist layers may be controlled and enhanced while the critical dimension magnitude of those patterned photoresist layers is decreased. It is towards that goal that the present invention is generally directed.

Methods for monitoring and/or controlling the critical dimension uniformity of patterned photoresist layers employed as etch mask layers in defining patterned layers within integrated circuits are known in the art of integrated circuit fabrication. For example, Yoo in U.S. Pat. No. 5,324,689 discloses a method for controlling critical dimension of a patterned photoresist layer employed as an etch mask in forming a patterned polysilicon layer within an integrated circuit. The method employs a planarizing spin-on-glass layer formed interposed between a blanket photoresist layer and the polysilicon layer desired to be patterned. In addition, Corliss, in U.S. Pat. No. 5,427,878 discloses an optical endpoint detection method employing multiple sensors for controlling the endpoint and monitoring the critical dimension uniformity when forming a patterned layer, such as a patterned photoresist layer, upon a semiconductor substrate. From one of the multiple sensors there is controlled the endpoint when forming the patterned layer, while from the group of multiple sensors there is determined the critical dimension uniformity of the patterned layer.

While Corliss' method bears particular relevance to the problem towards which the present invention is directed, Corliss' method by employing endpoint detection seeks inherently to compensate for all parametric variations encountered when forming a patterned layer, such as a patterned photoresist layer, by controlling either a blanket photoresist layer development time or a blanket layer etch time. Thus, while Corliss' method provides improved integrated circuit layer process control and monitoring, Corliss' method provides neither optimal process flexibility nor optimal critical dimension uniformity in forming within integrated circuits patterned layers, such as patterned photoresist layers.

Thus, desirable in the art are additional methods through which critical dimension uniformity may be controlled and enhanced, with enhanced process flexibility, within patterned photoresist layers which are employed in defining patterned layers within integrated circuits. It is towards the foregoing goal that the present invention is specifically directed.

SUMMARY OF THE INVENTION

A first object of the present invention is to provide a method for forming within an integrated circuit a patterned photoresist layer.

A second object of the present invention is to provide a method in accord with the first object of the present invention, where the patterned photoresist layer has a controlled and enhanced critical dimension uniformity.

A third object of the present invention is to provide a method in accord with the second object of the present invention where the controlled and enhanced critical dimension uniformity of the patterned photoresist layer is obtained with enhanced process flexibility.

In accord with the objects of the present invention there is provided by the present invention a method for forming with controlled and enhanced critical dimension uniformity, and with enhanced process flexibility a patterned photoresist layer within an integrated circuit. To practice the method of the present invention, there is first provided a method for forming upon a substrate layer within an integrated circuit a patterned photoresist layer from a blanket photoresist layer, where the method has a capability for forming the patterned photoresist layer with a target critical dimension. There is then identified within the method for forming the patterned photoresist layer from the blanket photoresist layer a minimum of one measurement parameter and one control parameter, where the measurement parameter within the method is accessible prior to the control parameter within the method. There is then established: (a) a measurement target value for the measurement parameter and a control target value for the control parameter such that when the measurement parameter is at the measurement target value and the control parameter is at the control target value the patterned photoresist layer is formed with the target critical dimension; and (b) a measurement parameter correlation coefficient correlating a variation of the measurement parameter with a variation of the target critical dimension and a control parameter correlation coefficient correlating a variation of the control parameter with a variation of the target critical dimension. There is then employed the method for forming the patterned photoresist layer from the blanket photoresist layer while measuring the value of the measurement parameter. Finally, there is compensated for a variation of the measurement parameter from the measurement target value by subsequently varying the control parameter from the control target value in accord with the measurement parameter correlation coefficient and the control parameter correlation coefficient to provide the patterned photoresist layer with the target critical dimension.

The present invention provides a method for forming within an integrated circuit, with controlled and enhanced critical dimension uniformity and with enhanced process flexibility, a patterned photoresist layer. The method of the present invention achieves these objects by compensating for a variation of a measurement parameter from a measurement target value by subsequently varying a control parameter from a control target value in accord with a measurement parameter correlation coefficient and a control parameter correlation coefficient when providing from a blanket photoresist layer the patterned photoresist layer with a target critical dimension. The measurement parameter correlation coefficient and the control parameter correlation coefficient are each correlated with the target critical dimension of the patterned photoresist layer. Since the measurement parameter and the control parameter may be selected from any of several parameters which influence the critical dimension uniformity of a patterned photoresist layer, and are not limited to photodevelopment time of the patterned photoresist layer, the patterned photoresist layer may be formed with controlled and enhanced critical dimension uniformity, and with maximum process flexibility.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the following drawings, which form a material part of this disclosure, wherein.

DESCRIPTION OF THE PREFERRED EMBODIMENT

The present invention provides a method for forming within an integrated circuit, with controlled and enhanced critical dimension uniformity and with enhanced process flexibility, a patterned photoresist layer from a blanket photoresist layer. The method of the present invention provides the patterned photoresist layer with controlled and enhanced critical dimension uniformity, and with enhanced process flexibility, through employing a measurement parameter and a control parameter, each of which is correlated through a correlation coefficient (ie: a measurement parameter correlation coefficient and a control parameter correlation coefficient) with the critical dimension of the patterned photoresist layer. When the measurement parameter is at a measurement target value and the control parameter is at a control target value, the patterned photoresist layer is formed with a target critical dimension. In the method for forming the patterned photoresist layer from the blanket photoresist layer the measurement parameter is measured and the control parameter is then adjusted in accord with the measurement parameter correlation coefficient and the control parameter correlation coefficient to provide the patterned photoresist layer with the target critical dimension.

The method of the present invention may be employed in forming patterned photoresist layers with controlled and enhanced critical dimension uniformity within various types of integrated circuits. The method of the present invention may be employed in forming patterned photoresist layers with controlled and enhanced critical dimension uniformity within integrated circuits including but not limited to dynamic random access memory (DRAM) integrated circuits, static random access memory (SRAM) integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors.

In addition, the method of the present invention may be employed in forming patterned photoresist layers with controlled and enhanced critical dimension uniformity in various locations and for various functions within integrated circuits. For example, patterned photoresist layers formed through the method of the present invention may be employed for functions including but not limited to lift-off masks and etch masks within integrated circuits.

Although the preferred embodiment of the method of the present invention discloses the method of the present invention employed in forming over a semiconductor substrate a patterned photoresist layer employed as an etch mask in forming a patterned silicon nitride layer, where the patterned silicon nitride layer is employed in a thermal oxidation mask in forming within and upon the semiconductor substrate field oxide isolation regions, the method of the present invention may also be employed in forming with controlled and enhanced critical dimension uniformity patterned photoresist layers over or under other types of layers within integrated circuits. Such other layers include, but are not limited to other insulator layers, conductor layers, semiconductor layers and photoactive layers. Typically such other layers will have a thickness of from about 1000 to about 9000 angstroms.

Figure 1:
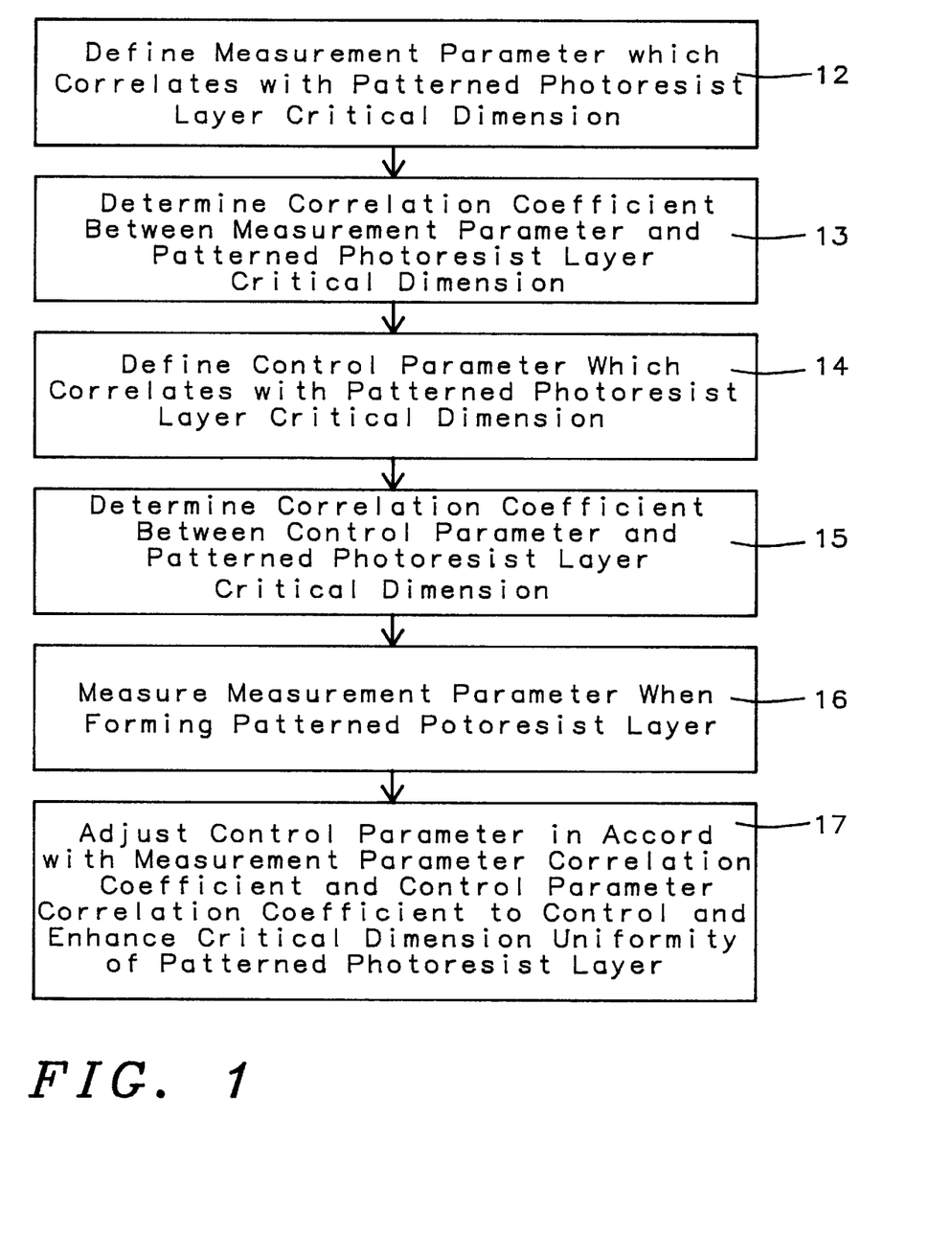
FIG. 1 shows a schematic process flow diagram illustrating the process steps within the method of the present invention

Referring now to FIG. 1, there is shown a schematic process flow diagram illustrating the process steps within the method of the present invention. Within FIG. 1, there is shown in step 12 a need for defining a measurement parameter and there is shown in step 14 a need for defining a control parameter, where both the measurement parameter and the control parameter correlate with the critical dimension of a patterned photoresist layer. For the method of the present invention, the measurement parameter and the control parameter may be any of several parameters, including but not limited to: (1) the thickness of a blanket photoresist layer from which is formed the patterned photoresist layer; (2) a photoexposure energy or dose employed in forming the patterned photoresist layer from the blanket photoresist layer; (3) a reflectivity of the substrate layer upon which is formed the patterned photoresist layer; (4) a developer type employed in developing the patterned photoresist layer; (5) a development condition employed in developing the patterned photoresist layer; and (6) for substrate layers which are both semi-transparent and semi-reflective, the thickness of the substrate layer. For optimal performance of the method of the present invention, it is preferred that both the measurement parameter and the control parameter correlate strongly with the critical dimension of the patterned photoresist layer.

It is also required for the method of the present invention that the measurement parameter within the method for forming the patterned photoresist layer is accessible prior to the control parameter within the method for forming the patterned photoresist layer. Further, although not specifically illustrated by the schematic process flow diagram of FIG. 1, the method of the present invention also contemplates that there may be employed more than one measurement parameter and/or more than one control parameter in forming from a blanket photoresist layer a patterned photoresist layer with controlled and enhanced critical dimension uniformity. Under situations of multiple measurement parameters and/or multiple control parameters the measurement parameters and the control parameters may be interposed in any order given the proviso that the first parameter with the method is a measurement parameter and the last parameter within the method is a control parameter.

Shown also in FIG. 1 are process step 13 and process step 15 which provide for determinations of; (1) a measurement parameter correlation coefficient between the measurement parameter and the patterned photoresist layer critical dimension; and (2) a control parameter correlation coefficient between the control parameter and the patterned photoresist layer critical dimension. Preferably, the measurement parameter correlation coefficient and the control parameter correlation coefficient are determined with respect to a critical dimension range of the patterned photoresist layer which includes the target critical dimension of the patterned photoresist layer. Preferably, the measurement parameter correlation coefficient and the control parameter correlation coefficient are determined while maintaining constant all remaining parameters which influence the critical dimension of the patterned photoresist layer.

Shown as the net process step 16 within FIG. 1 is the measurement of the measurement parameter when forming the patterned photoresist layer, and there is shown as the final process step 17 within the schematic process flow diagram of FIG. 1 adjustment of the control parameter when forming the patterned photoresist layer, where the adjustment of the control parameter is undertaken in accord with the measurement parameter correlation coefficient and the control parameter correlation coefficient.

Due to the use of both the measurement parameter correlation coefficient and the control parameter correlation coefficient in adjusting the control parameter, as well as the opportunity for multiple measurement parameters and multiple control parameters within the method of the present invention, there is provided by the method of the present invention a controlled and enhanced critical dimension uniformity of the patterned photoresist layer, with enhanced process flexibility. In that regard, the method of the present invention provides for compensation, through at least one control parameter, of target critical dimension non-uniformity of a patterned photoresist layer prior to developing the patterned photoresist layer from a blanket photoresist layer. Thus, through the method of the present invention target critical dimension uniformity may be controlled and enhanced under circumstances where target critical dimension non-uniformity of a patterned photoresist layer may be unavoidable through methods as are conventional in the art.

Figure 2:
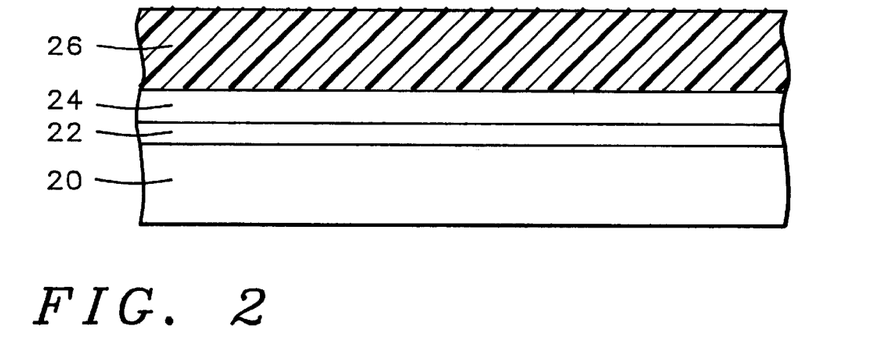
FIG. 2 to FIG. 6 show a series of schematic cross-sectional diagrams illustrating the results of progressive process stages in forming through the preferred embodiment of the method of the present invention a patterned photoresist layer employed in defining a patterned silicon nitride layer employed within a thermal oxidation mask for forming field oxide isolation regions within and upon a semiconductor substrate.

Referring now to FIG. 2 to FIG. 6, there is shown a series of schematic cross-sectional diagrams illustrating the results of forming a patterned photoresist layer with controlled and enhanced critical dimension uniformity through the method of the present invention, where the patterned photoresist layer is employed in defining a patterned silicon nitride layer employed within a thermal oxidation mask for forming field oxide isolation regions within and upon a semiconductor substrate. Shown in FIG. 2 is a schematic cross-sectional diagram of the semiconductor substrate at an early stage in its processing.

Shown in FIG. 2 is a semiconductor substrate 20 having formed thereupon a blanket pad oxide layer 22. In turn, the blanket pad oxide layer 22 has formed thereupon a blanket silicon nitride layer 24. Finally, the blanket silicon nitride layer 24 has formed thereupon a blanket photoresist layer 26. Each of the semiconductor substrate 20, the blanket pad oxide layer 22, the blanket silicon nitride layer 24 and the blanket photoresist layer 26 may be formed through methods and materials as are conventional in the art of integrated circuit fabrication.

Although semiconductor substrates are known in the art with either dopant polarity, various dopant concentrations and several crystallographic orientations, for the preferred embodiment of the method of the present invention, the semiconductor substrate 20 is preferably a (100) silicon semiconductor substrate having an N- or P- doping. Similarly, although it is also known in the art that blanket pad oxide layers may be formed upon semiconductor substrates through methods including but not limited to blanket pad oxide layer thermal growth methods and blanket pad oxide layer deposition methods, the blanket pad oxide layer 22 within the preferred embodiment of the method of the present invention is preferably formed upon the semiconductor substrate 20 through a blanket pad oxide thermal growth method at a temperature of from about 910 to about 930 degrees centigrade to form a blanket pad oxide layer 22 of thickness about 180 to about 220 angstroms. Similarly, although blanket silicon nitride layers may be formed within integrated circuits through methods including but not limited to chemical vapor deposition (CVD) methods, plasma enhanced chemical vapor deposition (PECVD) methods and physical vapor deposition (PVD) sputtering methods, the blanket silicon nitride layer 24 is preferably formed upon the blanket pad oxide layer 22 through a chemical vapor deposition (CVD) method employing a suitable silicon source material and a suitable nitrogen source material to form a blanket silicon nitride layer 24 of thickness about 1000 to about 2000 angstroms. Finally, although it is also known in the art that blanket photoresist layers may be formed within integrated circuits from photoresist materials including but not limited to positive photoresist materials and negative photoresist materials, the blanket photoresist layer 26 is preferably formed upon the blanket silicon nitride layer 24 from a positive photoresist material such as but not limited to a novolak positive photoresist material or a poly-methyl-meth-acrylate (PMMA) positive photoresist material since there may typically be formed from such positive photoresist materials patterned photoresist layers with enhanced stability and resolution. Preferably, the thickness of the blanket photoresist layer 26 is from about 8000 to about 8200 angstroms.

Figure 3:
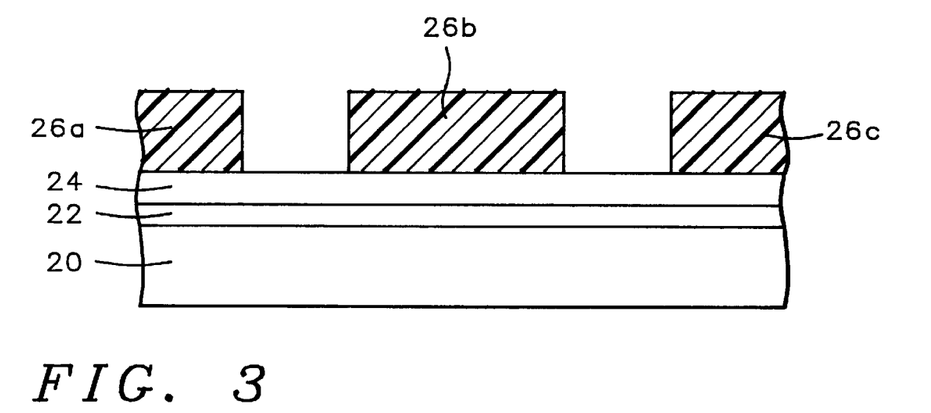

Referring now to FIG. 3, there is shown a schematic cross-sectional diagram illustrating the results of further processing of the semiconductor substrate 20 whose schematic cross-sectional diagram is illustrated in FIG. 2. Shown in FIG. 3 is the results of patterning through the method of the present invention the blanket photoresist layer 26 to form the patterned photoresist layers 26a, 26b and 26c. When forming from the blanket photoresist layer 26 the patterned photoresist layers 26a, 26b and 26c, a particularly sensitive measurement parameter is the thickness of the blanket silicon nitride layer 24. The thickness of the blanket silicon nitride layer 24 is a particularly sensitive parameter since the blanket silicon nitride layer 24 is semi-transparent and semi-reflective. Due to the semi-transparent and semi-reflective character of the blanket silicon nitride layer 24, photoexposure radiation employed in photoexposing the blanket photoresist layer 26 is reflected back into the blanket photoresist layer 26 from reflection at both: (1) the interface of the blanket silicon nitride layer 24 with the blanket pad oxide layer 22; and (2) the interface of the blanket silicon nitride layer 24 with the blanket photoresist layer 26. Since the phase relationship between these two beams of reflected photoexposure radiation is influenced by the thickness of the blanket silicon nitride layer 24, the thickness of the blanket silicon nitride layer 24 thus provides a sensitive measurement or control parameter for critical dimension of the patterned photoresist layers 26a, 26b and 26c.

As is understood by a person skilled in the art, other semi-transparent and semi-reflective layers are also known within the art of integrated circuit fabrication. These other semi-transparent and semi-reflective layers include but are not limited to other insulator layers and polysilicon layers. The thickness of such other semi-transparent and semi-reflective layers would also provide a sensitive measurement parameter or a sensitive control parameter for forming a patterned photoresist layer through the method of the present invention, when such other semi-transparent and semi-reflective layers are employed as substrate layers beneath blanket photoresist layers from which are formed patterned photoresist layers.

As a control parameter within the preferred embodiment of the method of the present invention there is chosen the photoexposure dose employed in forming the patterned photoresist layers 26a, 26b and 26c from the blanket photoresist layer 26. Thus, while the thickness of the blanket silicon nitride layer 24 correlates with the critical dimension of the patterned photoresist layers 26a, 26b and 26c, a drift from a target critical dimension of the patterned photoresist layers 26a, 26b and 26c may be compensated by an adjustment of the photoexposure radiation dose employed in forming the patterned photoresist layers 26a, 26b and 26c from the blanket photoresist layer 26.

While the preferred embodiment of the method of the present invention illustrates the method of the present invention employing a measurement parameter related indirectly to photoexposure dose and a control parameter also related directly to photoexposure dose, it is nonetheless understood by a person skilled in the art that the method of the present invention may also be employed when the measurement parameter and the control parameter are not as directly related to the same factor which influences critical dimension of the patterned photoresist layer. In that regard, for example and without limitation, it is feasible within the method of the present invention that the measurement parameter may relate to photoexposure dose while the control parameter may relate to photodevelopment conditions. While it is in general preferred that the measurement parameter and the control parameter are directed towards the same factor which influences the critical dimension of a patterned photoresist layer, such is not required with the method of the present invention.

Figure 4:
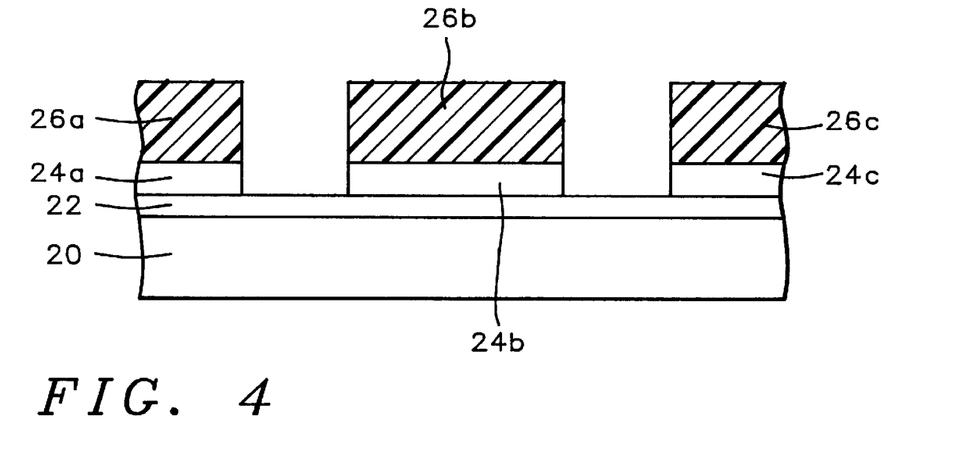

Referring now to FIG. 4, there is shown a schematic cross sectional diagram illustrating the results of further processing of the semiconductor substrate 20 whose schematic cross-sectional diagram is illustrated in FIG. 3. Shown in FIG. 4 is the results of patterning, while employing the patterned photoresist layers 26a, 26b and 26c as an etch mask layer, the blanket silicon nitride layer 24 to form the patterned silicon nitride layer 24a, 24b and 24c. Such etching may be undertaken through methods as are conventional in the art, including but not limited to wet chemical etching methods employing refluxing phosphoric acid and reactive ion etch (RIE) etching methods employing fluorine containing etchant gas compositions. For the preferred embodiment of the method of the present invention, the patterned silicon nitride layers 24a. 24b and 24c are preferably etched from the blanket silicon nitride layer 24 employing a wet chemical etch method, in order to avoid over-etching into the blanket pad oxide layer 22.

Figure 5:
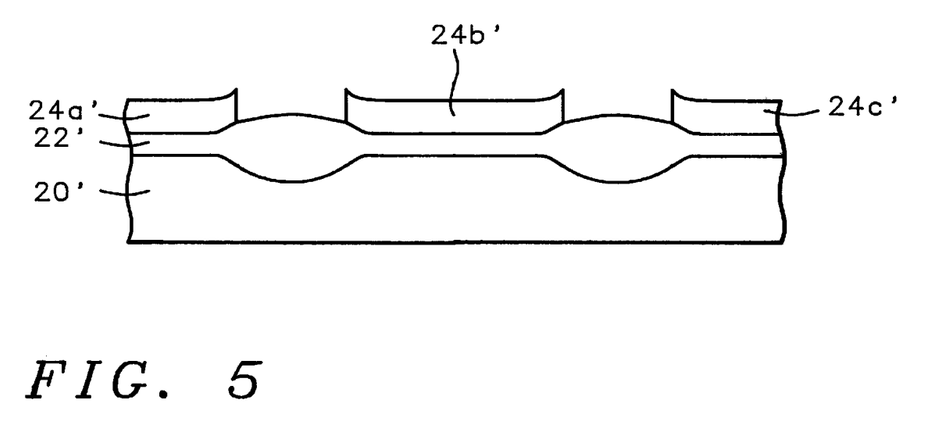

Referring now to FIG. 5, there is shown a schematic cross-sectional diagram illustrating the results of further processing of the semiconductor substrate 20 whose schematic cross-sectional diagram is illustrated in FIG. 4. Shown in FIG. 5 is a schematic cross-sectional diagram of a semiconductor substrate otherwise equivalent to the schematic cross-sectional diagram of the semiconductor substrate 20 illustrated in FIG. 4, but from whose surface has been removed the patterned photoresist layers 26a, 26b and 26c. The patterned photoresist layers may be removed through methods as are conventional in the art, which will typically, although not exclusively, include oxygen plasma stripping methods or organic solvent stripping methods. There is then thermally oxidized the semiconductor substrate 20 to form the thermally oxidized semiconductor substrate 20', the thermally oxidized blanket pad oxide layer 22' and the thermally oxidized patterned silicon nitride layers 24a', 24b' and 24c'. Preferably, the semiconductor substrate 20 is thermally oxidized to form the thermally oxidized semiconductor substrate 20', the thermally oxidized blanket pad oxide layer 22' and the thermally oxidized patterned silicon nitride layers 24a', 24b' and 24c' through methods as are conventional in the art, which will typically, although not exclusively employ a temperature of from about 740 to about 780 degrees centigrade for a time period of from about 90 to about 100 minutes.

Figure 6:
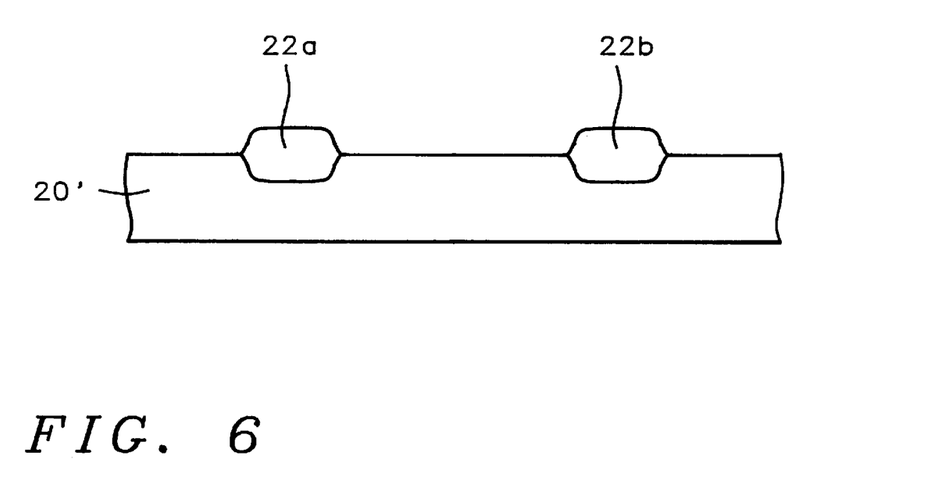

Referring now to FIG. 6, there is shown a schematic cross-sectional diagram illustrating the results of further processing the thermally oxidized semiconductor substrate 20' whose schematic cross sectional diagram is illustrated in FIG. 5. Shown in FIG. 6 is the results of successively completely stripping from the thermally oxidized semiconductor substrate 20' whose schematic cross-sectional diagram is illustrated in FIG. 5 the thermally oxidized patterned silicon nitride layers 24a', 24b' and 24c' and then partially etching the thermally oxidized blanket pad oxide layer 22' to form the isolation regions 22a and 22b within and upon the thermally oxidized semiconductor substrate 20'. Typically and preferably, although not exclusively, the thermally oxidized patterned silicon nitride layers 24a', 24b' and 24c' are stripped to yield the thermally oxidized semiconductor substrate 20' whose schematic cross-sectional diagram is illustrated in FIG. 6 through exposure to refluxing phosphoric acid, while the thermally oxidized pad oxide layer 22' is partially etched to yield the isolation regions 22a and 22b within the thermally oxidized semiconductor substrate 20' through immersion in dilute hydrofluoric acid (DHF) followed by deionized water rinsing and drying through methods as are conventional in the art.

Upon forming the thermally oxidized semiconductor substrate 20' whose schematic cross-sectional diagram is illustrated in FIG. 6, there is formed a thermally oxidized semiconductor substrate 20' having formed therein and thereupon isolation regions 22a and 22b with controlled and enhanced critical dimension uniformity since the patterned photoresist layers 26a, 26b and 26c indirectly employed in forming the isolation regions 22a and 22b were formed with controlled and enhanced critical dimension uniformity through the method of the present invention.

EXAMPLE

The preferred embodiment of the method of the present invention was employed in forming upon a series of semiconductor substrates patterned photoresist layers with controlled and enhanced critical dimension uniformity. The patterned photoresist layers were subsequently employed in forming patterned silicon nitride layers which were subsequently in turn employed within thermal oxidation masks in forming silicon oxide isolation regions within and upon the semiconductor substrates. The method was employed within a manufacturing environment.

The semiconductor substrates were (100) silicon semiconductor substrates having formed thereupon blanket pad oxide layers of thickness about 200 angstroms through a thermal oxidation method at a temperature of about 920 degrees centigrade. Formed upon the blanket pad oxide layers were blanket silicon nitride layers of nominal thickness about 1500 angstroms, and formed upon the blanket silicon nitride layers were blanket positive photoresist layers of a novolak positive photoresist material available from Sumitomo Chemical Co., Ltd., 1-98, Kasugade-Nake 3-Chome Konohana-Ku, Osaka 554, Japan as PFi-38A8 photoresist material. The blanket positive photoresist layers were formed to a thickness of about 8100 angstroms.

Figure 7:
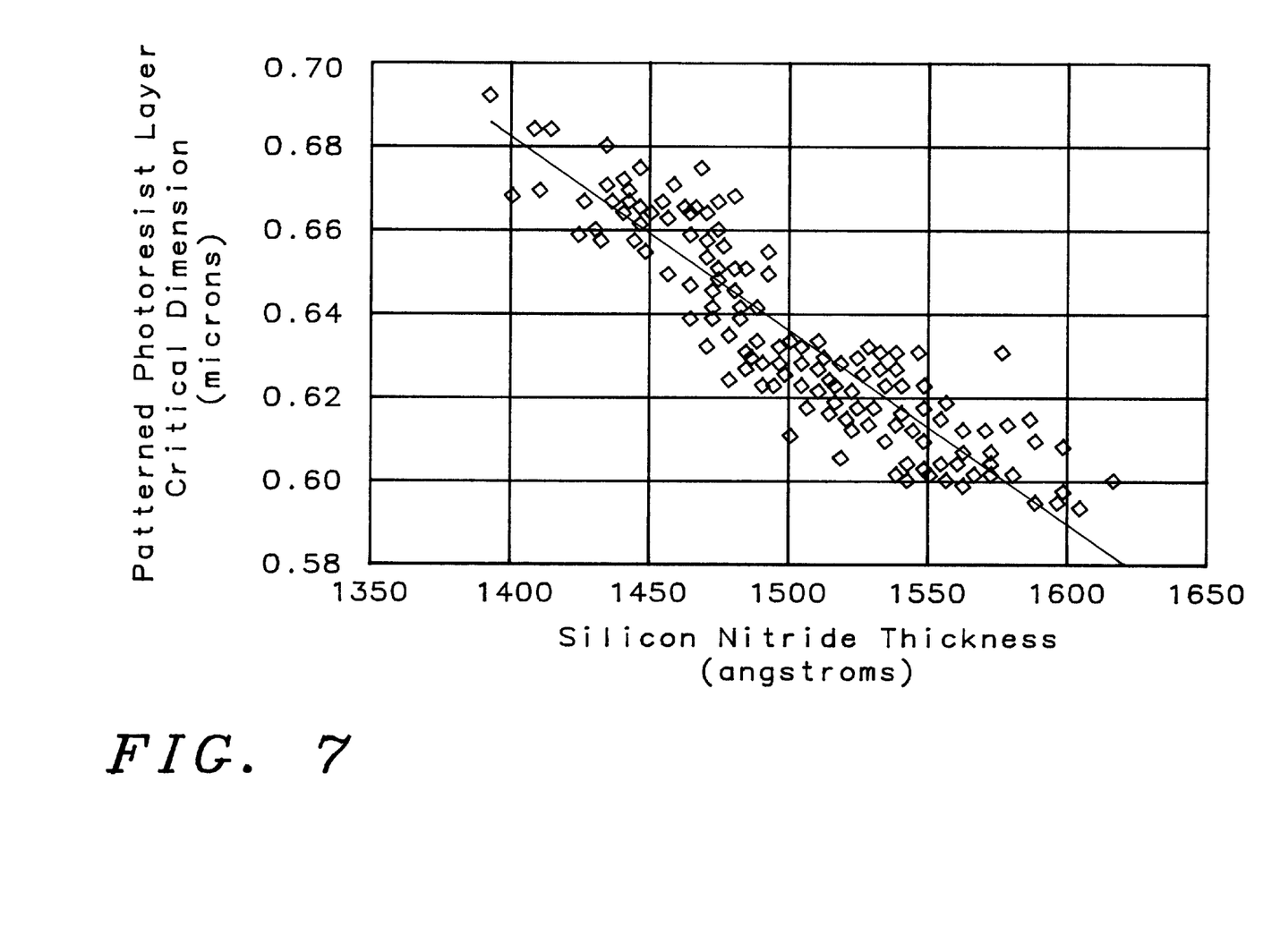
FIG. 7 shows a graph of Patterned Photoresist Layer Critical Dimension versus Silicon Nitride Thickness from which there is determined a measurement parameter correlation coefficient in accord with the preferred embodiment of the method of the present invention.

Prior to forming the blanket positive photoresist layers upon the semiconductor substrates there was first determined a correlation coefficient of silicon nitride thickness with patterned photoresist layer critical dimension for a patterned photoresist layer nominal critical dimension of 0.65 microns, where all other parameters within the photolithographic method were maintained constant. The data employed in determining the correlation coefficient are shown graphically in FIG. 7, as a plot of Patterned Photoresist Layer Critical Dimension versus Silicon Nitride Thickness. Through a linear regression analysis of the data shown in the plot of FIG. 7 there was obtained the equation Patterned Photoresist Layer Critical Dimension (microns)=−0.000465 (Silicon Nitride Thickness (microns))+1.331 microns. Thus the correlation coefficient between patterned photoresist layer critical dimension and silicon nitride thickness was −0.000465.

Figure 8:
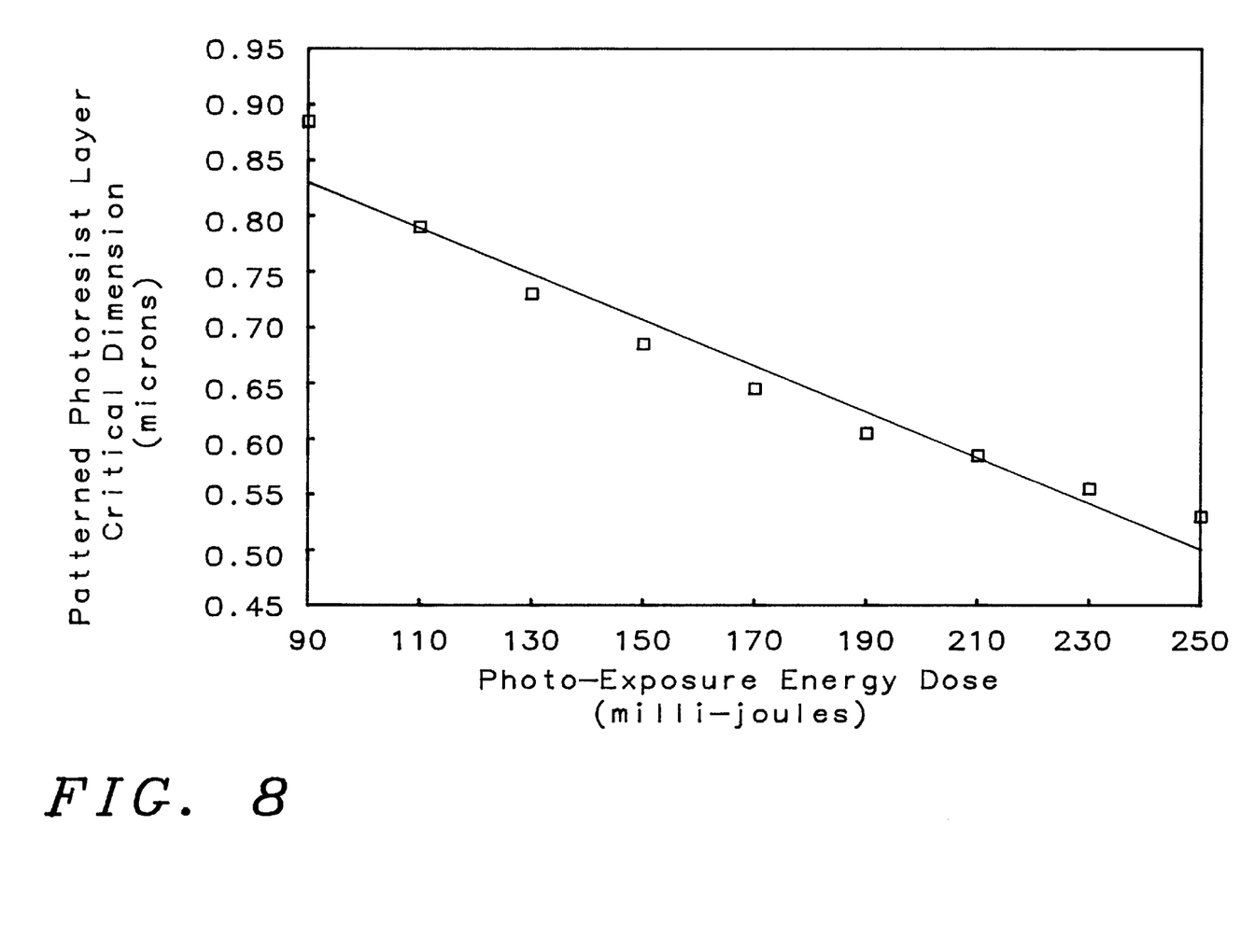
FIG. 8 shows a graph of Patterned Photoresist Layer Critical Dimension versus Photo-Exposure Energy Dose from which there is determined a control parameter correlation coefficient in accord with the preferred embodiment of the method of the present invention.

Similarly, there was also determined a correlation coefficient of patterned photoresist layer critical dimension with photoexposure energy dose, also under conditions where all remaining variables were held constant. The data employed in determining the correlation coefficient as shown graphically in FIG. 8, as a plot of Patterned Photoresist Layer Critical Dimension versus Photo-Exposure Energy Dose. Through a linear regression analysis of the data shown in FIG. 8, there was obtained the equation Patterned Photoresist Layer Critical Dimension (microns)=−0.0021 microns/milli-joule (Photo-Exposure Energy Dose (milli-joules))+1.023 microns. Thus, the correlation coefficient between the patterned photoresist layer critical dimension and the photoexposure energy dose was −0.0021 microns per milli-joule.

Figure 9:
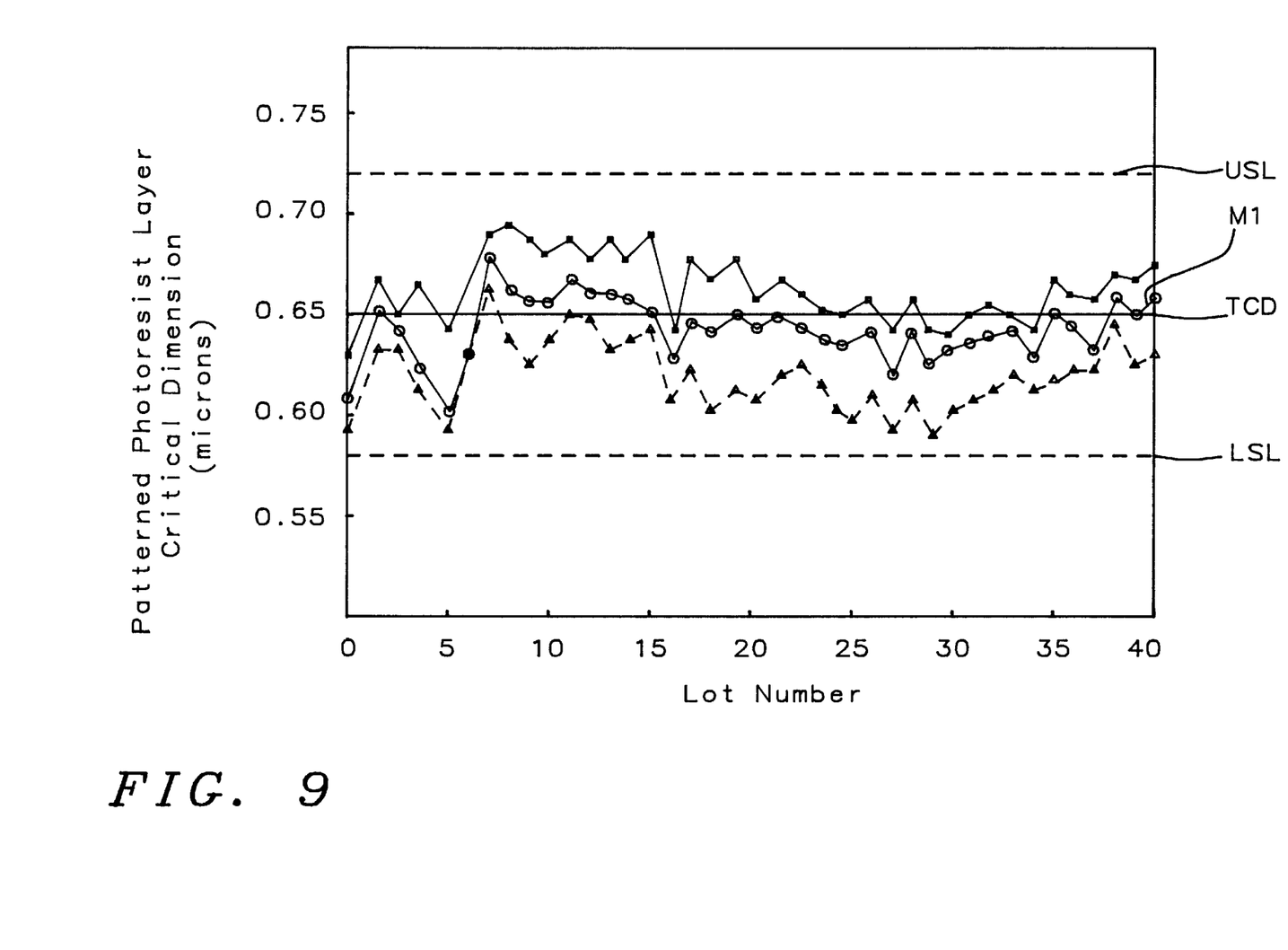
FIG. 9 shows a statistical process control (SPC) graph illustrating critical dimension variations of patterned photoresist layers employed in defining patterned silicon nitride layers through a method conventional in the art.
Figure 10:
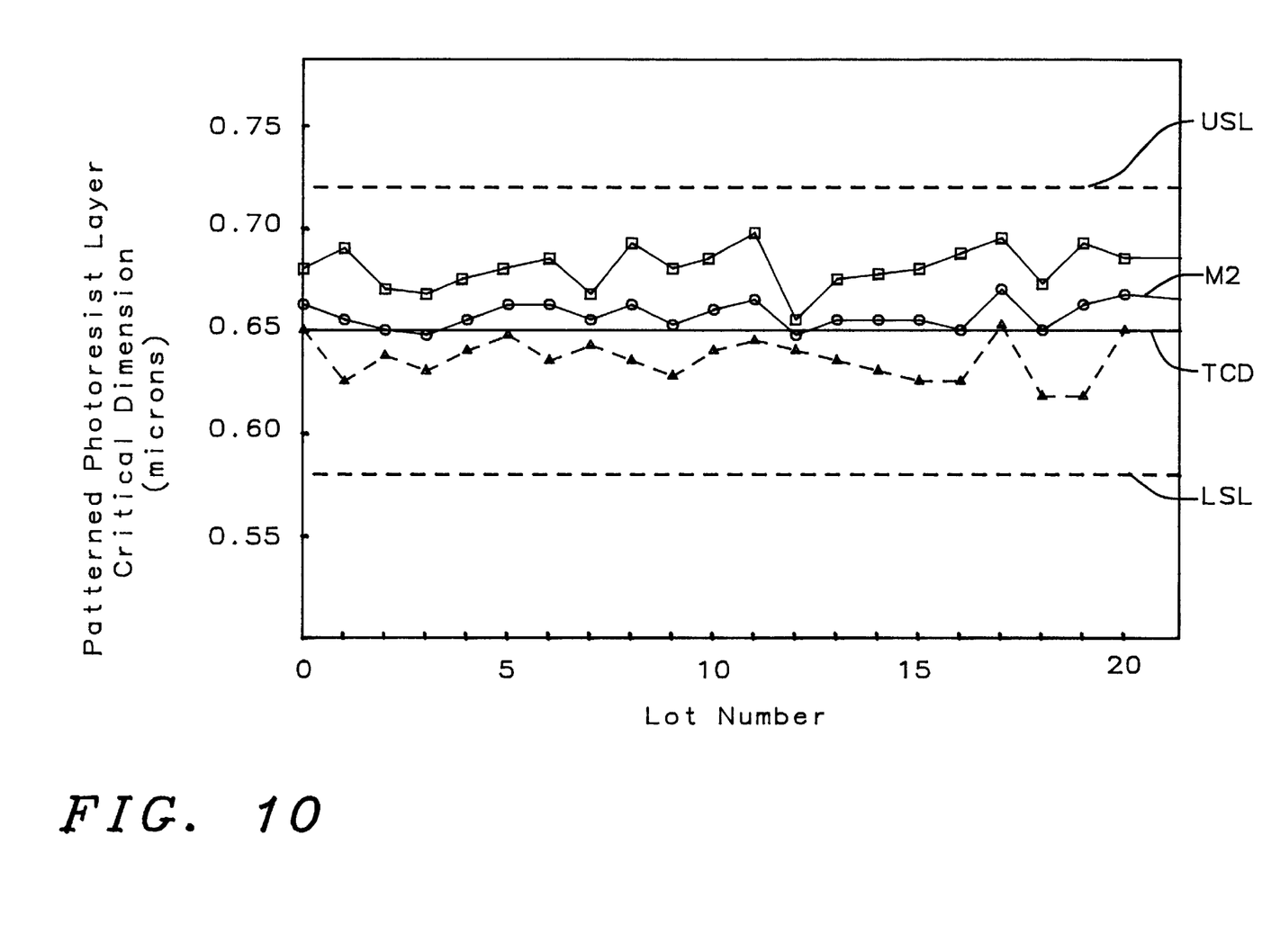
FIG. 10 shows a statistical process control (SPC) graph illustrating critical dimension variations of patterned photoresist layers employed in defining patterned silicon nitride layers through the preferred embodiment of the method of the present invention.

The method of the present invention was then employed using the silicon nitride thickness as the measurement parameter and the photoexposure energy dose as the control parameter, along with a target critical dimension for the patterned photoresist layers of 0.65 microns. Statistical process control (SPC) charts illustrating the process control of critical dimension of the patterned photoresist layers are shown in FIG. 9 and FIG. 10. Within both FIG. 9 and FIG. 10 there is plotted Patterned Photoresist Layer Critical Dimension versus Lot Number for semiconductor substrate wafers within the manufacturing environment. Within both FIG. 9 and FIG. 10 there is shown a target critical dimension TCD of the patterned photoresist layers of 0.65 microns, an upper specification limit USL of 0.72 microns and a lower specification limit LSL of 0.58 microns. Finally, there is shown in FIG. 9 a line M1 connecting the mean values of measured patterned photoresist layer critical dimensions and there is shown in FIG. 10 a line M2 connecting the mean values of measured patterned photoresist layer critical dimensions. The remaining data points in FIG. 9 and FIG. 10 represent +/− three standard deviation units of the mean measured critical dimensions of the patterned photoresist layers (ie: square data points represent +3 standard deviation units, while triangular data points represent −3 standard deviation units). FIG. 9 represents the statistical process control (SPC) chart for the patterned photoresist layer critical dimension uniformity without use of the method of the present invention, while FIG. 10 represents the statistical process control (SPC) chart for the patterned photoresist layer critical dimension uniformity with the use of the method of the present invention.

For the data in both FIG. 9 and FIG. 10, there was calculated through methods as are conventional in the art the process capability parameters Cp and Cpk, where Cp is a measure of the inherent variability of the data (ie: Cp=(upper specification limit (USL)—lower specification limit (LSL))/6 times standard deviation (SD) of the measured data) and Cpk is a measure of the inherent variability of the data normalized to the mean of the data (ie: Cpk=Cp (1—((mean critical dimension (M)—target critical dimension (TCD))/(upper specification limit (USL)—lower specification limit (USL)). Higher values of Cp and Cpk indicate greater uniformity of data. Measured values of the patterned photoresist layer critical dimensions, along with standard deviations, Cp values and Cpk values are reported in Table I.

TABLE I

| Invention | P/R C/D (microns) | Std: Deviation (microns) | Cp | Cpk |
|---|---|---|---|---|
| no | 0.643 | +/−0.017 | 1.37 | 1.22 |
| yes | 0.659 | +/−0.011 | 2.15 | 1.88 |

From review of the data in Table I it is seen that there is provided through the method of the present invention a patterned photoresist layer with a higher critical dimension uniformity in comparison with an otherwise equivalent patterned photoresist layer formed in absence of the method of the present invention.

As is understood by a person skilled in the art, the preferred embodiment and example of the present invention are illustrative of the present invention rather than limiting of the present invention. Revisions and modifications may be made to methods, materials, structures and dimensions through which is practiced the preferred embodiment and example of the present invention while still forming embodiments and examples which are within the spirit and scope of the present invention, as defined by the appended claims.

What is claimed is:

1. A method for forming a patterned photoresist layer comprising:

providing a method for forming upon a substrate layer a patterned photoresist layer from a blanket photoresist layer, the method having a capability for forming the patterned photoresist layer with a target critical dimension;

identifying within the method for forming the patterned photoresist layer from the blanket photoresist layer a minimum of one measurement parameter and one control parameter, where the measurement parameter within the method is accessible prior to the control parameter within the method;

establishing:

(a) a measurement target value for the measurement parameter and a control target value for the control parameter such that when the measurement parameter is at the measurement target value and the control parameter is at the control target value the patterned photoresist layer is formed with the target critical dimension; and (b) a measurement parameter correlation coefficient correlating a variation of the measurement parameter with a variation of the target critical dimension and a control parameter correlation coefficient correlating a variation of the control parameter with the variation of the target critical dimension;

employing the method for forming the patterned photoresist layer from the blanket photoresist layer while measuring the value of the measurement parameter; and compensating for a variation of the measurement parameter from the measurement target value by subsequently varying the control parameter from the control target value in accord with the measurement parameter correlation coefficient and the control parameter correlation coefficient to provide the patterned photoresist layer with the target critical dimension.

2. The method of claim 1 wherein:

the substrate layer is chosen from the group of substrate layers consisting of insulator layers, conductor layers, semiconductor layers and photoactive layers; and the substrate layer has a thickness of from about 1000 to about 9000 angstroms.

3. The method of claim 1 wherein the measurement parameter is chosen from the group of measurement parameters consisting of the blanket photoresist layer thickness, a photoexposure energy employed in forming the patterned photoresist layer, a photoexposure dose employed in forming the patterned photoresist layer, a reflectivity of the substrate layer, a developer type employed in developing the patterned photoresist layer, a development condition employed in developing the patterned photoresist layer and the substrate layer thickness.

4. The method of claim 1 wherein the control parameter is chosen from the group of control parameters consisting of the blanket photoresist layer thickness, a photoexposure energy employed in forming the patterned photoresist layer, a photoexposure dose employed in forming the patterned photoresist layer, a reflectivity of the substrate layer, a developer type employed in developing the patterned photoresist layer, a development condition employed in developing the patterned photoresist layer and the substrate layer thickness.

5. A method for forming a patterned photoresist layer upon a semi-transparent and semi-reflective substrate layer comprising:

providing a method for forming upon a semi-transparent semi-reflective substrate layer a patterned photoresist layer from a blanket photoresist layer, the method having a capability for forming the patterned photoresist layer with a target critical dimension;

identifying within the method for forming the patterned photoresist layer from the blanket photoresist layer a minimum of one measurement parameter and one control parameter, where the measurement parameter within the method is accessible prior to the control parameter within the method;

establishing:

(a) a measurement target value for the measurement parameter and a control target value for the control parameter such that when the measurement parameter is at the measurement target value and the control parameter is at the control target value the patterned photoresist layer is formed with the target critical dimension; and (b) a measurement parameter correlation coefficient correlating a variation of the measurement parameter with a variation of the target critical dimension and a control parameter correlation coefficient correlating a variation of the control parameter with the variation of the target critical dimension;

employing the method for forming the patterned photoresist layer from the blanket photoresist layer while measuring the value of the measurement parameter; and compensating for a variation of the measurement parameter from the measurement target value by subsequently varying the control parameter from the control target value in accord with the measurement parameter correlation coefficient and the control parameter correlation coefficient to provide the patterned photoresist layer with the target critical dimension.

6. The method of claim 5 wherein the measurement parameter is chosen from the group of measurement parameters consisting of the blanket photoresist layer thickness, a photoexposure energy employed in forming the patterned photoresist layer, a photoexposure dose employed in forming the patterned photoresist layer, a reflectivity of the substrate layer, a developer type employed in developing the patterned photoresist layer, a development condition employed in developing the patterned photoresist layer and the substrate layer thickness.

7. The method of claim 5 wherein the control parameter is chosen from the group of control parameters consisting of the blanket photoresist layer thickness, a photoexposure energy employed in forming the patterned photoresist layer, a photoexposure dose employed in forming the patterned photoresist layer, a reflectivity of the substrate layer, a developer type employed in developing the patterned photoresist layer, a development condition employed in developing the patterned photoresist layer and the substrate layer thickness.

8. The method of claim 5 wherein the measurement parameter is the semi-transparent and semi-reflective substrate layer thickness and the control parameter is a photoexposure energy employed in forming the patterned photoresist layer from the blanket photoresist layer.

9. A method for forming a patterned photoresist layer upon a silicon nitride substrate layer comprising:

provilng a method for forming upon a silicon nitride substrate layer a patterned photoresist layer from a blanket photoresist layer, the method having a capability for forming the patterned photoresist layer with a target critical dimension, the method employing a silicon nitride substrate layer thickness as a measurement parameter and a photoexposure dose as a control parameter;

establishing:

(a) a silicon nitride substrate layer thickness target value and a photoexposure dose target value such that the patterned photoresist layer is formed with the target critical dimension; and (b) a silicon nitride substrate layer thickness correlation coefficient correlating a variation of the silicon nitride substrate layer thickness with a variation of the target critical dimension and a photoexposure dose correlation coefficient correlating a variation of the photoexposure dose with the variation of the target critical dimension;

employing the method for forming the patterned photoresist layer from the blanket photoresist layer while measuring the silicon nitride substrate layer thickness; and compensating for a variation of the silicon nitride substrate layer thickness from the silicon nitride substrate layer thickness target value by subsequently varying the photoexposure dose from the photoexposure dose target value in accord with the silicon nitride substrate layer thickness correlation coefficient and the photoexposure dose correlation coefficient to provide the patterned photoresist layer with the target critical dimension.

10. The method of claim 8 wherein the silicon nitride substrate layer thickness is from about 1000 to about 2000 angstroms.

* * * * *